US008878969B2

(12) United States Patent
Holscher et al.

(10) Patent No.: US 8,878,969 B2
(45) Date of Patent: Nov. 4, 2014

(54) IMAGING SYSTEMS WITH COLOR FILTER BARRIERS

(75) Inventors: Richard Holscher, Boise, ID (US); Gennadiy Agranov, San Jose, CA (US); Dongqing Cao, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 147 days.

(21) Appl. No.: 13/550,539

(22) Filed: Jul. 16, 2012

(65) Prior Publication Data
US 2013/0027577 A1 Jan. 31, 2013

Related U.S. Application Data (60) Provisional application No. 61/512,319, filed on Jul. 27, 2011.

(51) Int. Cl.
*H04N 3/14* (2006.01)
*H04N 5/335* (2011.01)
*H04N 9/04* (2006.01)
*H04N 9/083* (2006.01)
*H01L 27/146* (2006.01)

(52) U.S. Cl.
CPC .... *H01L 27/14629* (2013.01); *H01L 27/14623* (2013.01); *H01L 27/14621* (2013.01)
USPC .......................................................... 348/273

(58) Field of Classification Search
CPC . H04N 9/045; H04N 2209/046; G06T 3/4015
USPC .......................... 348/272, 273, 275, 279, 280
See application file for complete search history.

(56) References Cited

U.S. PATENT DOCUMENTS

| | | |
|---|---|---|
| 2007/0166511 A1 | 7/2007 | Wang et al. |
| 2007/0238034 A1 | 10/2007 | Holscher, Jr. |
| 2009/0020838 A1 | 1/2009 | Lin et al. |
| 2009/0101946 A1 | 4/2009 | Hwang |
| 2010/0060769 A1 * | 3/2010 | Inuiya ............................ 348/311 |
| 2010/0110271 A1 | 5/2010 | Yanagita et al. |
| 2010/0245637 A1 | 9/2010 | Itonaga |
| 2010/0253819 A1 | 10/2010 | Yokozawa |
| 2011/0037854 A1 * | 2/2011 | Godaiin ......................... 348/164 |
| 2011/0279727 A1 * | 11/2011 | Kusaka .......................... 348/340 |
| 2012/0019695 A1 * | 1/2012 | Qian et al. .................... 348/273 |
| 2012/0273906 A1 * | 11/2012 | Mackey et al. ................ 257/432 |
| 2013/0010072 A1 * | 1/2013 | Kim et al. ...................... 348/46 |

FOREIGN PATENT DOCUMENTS

WO 2007145373 12/2007

\* cited by examiner

*Primary Examiner* — Gevell Selby
(74) *Attorney, Agent, or Firm* — Treyz Law Group; Kendall P. Woodruff (57) ABSTRACT

An image sensor may be provided in which a pixel array includes imaging pixels and application-specific pixels. The application-specific pixels may include depth-sensing pixels, infrared imaging pixels, or other types of application-specific pixels. A color filter array may be formed over the pixel array. The color filter array may include Bayer color filter array formed over the imaging pixels. The color filter array may also include a plurality of green color filter elements formed over the application-specific pixels. Barrier structures may be interposed between imaging pixels and application-specific pixels. The barrier structures may be configured to reduce or eliminate optical crosstalk between imaging pixels and adjacent application-specific pixels. The barrier structures may include an opaque photodefinable material such as black or blue photodefinable material that may be configured to filter out wavelength bands of interest. The barrier structures may be formed during the color filter array fabrication process.

19 Claims, 6 Drawing Sheets

IMAGING SYSTEMS WITH COLOR FILTER BARRIERS

This application claims the benefit of provisional patent application No. 61/512,319, filed Jul. 27, 2011, which is hereby incorporated by reference herein in its entirety.

BACKGROUND

This relates generally to imaging devices, and more particularly, to imaging devices with color filter barriers.

Modern electronic devices such a cellular telephones, cameras, and computers often use digital image sensors. Imagers (i.e., image sensors) may be formed from a two-dimensional array of image sensing pixels. Each pixel may include a photosensor such as a photodiode that receives incident photons (light) and converts the photons into electrical signals. Image sensors are sometimes designed to provide images to electronic devices using a Joint Photographic Experts Group (JPEG) format or any other suitable image format.

Imagers may be provided with color filter arrays. A color filter array may include an array of color filters formed over an array of photosensors. Each color filter in the color filter array may be optimized to pass a given wavelength band of the electromagnetic spectrum. For example, a color filter array may include red color filters which are optimized to pass a wavelength band corresponding to red light, blue color filters which are optimized to pass a wavelength band corresponding to blue light, and green color filters which are optimized to pass a wavelength band corresponding to green light. Various interpolation and signal processing schemes may be used to construct a full-color image using the image data which is gathered from an imager having a color filter array.

In addition to capturing images of a scene, some imagers may be capable of performing other functions. Imagers sometimes include application-specific pixels which are capable of performing specific functions and are not necessarily used for capturing images. Application-specific pixels may be formed adjacent to imaging pixels. If care is not taken, the presence of application-specific pixels in an array of imaging pixels may exacerbate optical crosstalk in an imager. For example, optical crosstalk that occurs between an imaging pixel and an adjacent application-specific pixel may be more difficult to correct than optical crosstalk between adjacent imaging pixels.

It would therefore be desirable to be able to provide imaging devices with color filter barriers for reducing optical crosstalk.

DETAILED DESCRIPTION

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Image sensors may be provided with color filter arrays having color filter barriers between adjacent colors in the color filter arrays. Color filter arrays having color filter barriers may be provided for complementary metal-oxide-semiconductor (CMOS) image sensors or charge-coupled device (CCD) image sensors. Image sensors may be front-side illumination (FSI) image sensors or backside illumination (BSI) image sensors.

Figure 1:
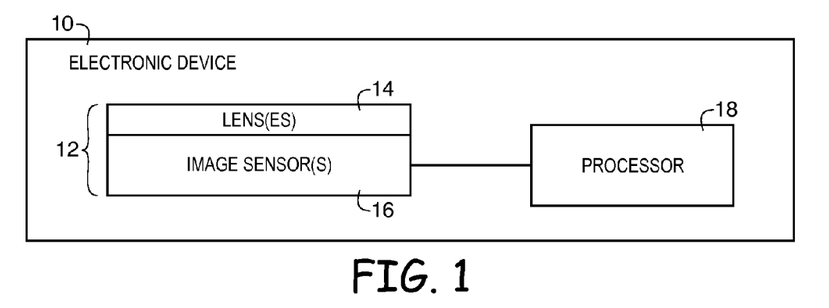
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. Image sensor 16 may, for example, be a backside illumination image sensor. If desired, camera module 12 may be provided with an array of lenses 14 and an array of corresponding image sensors 16.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
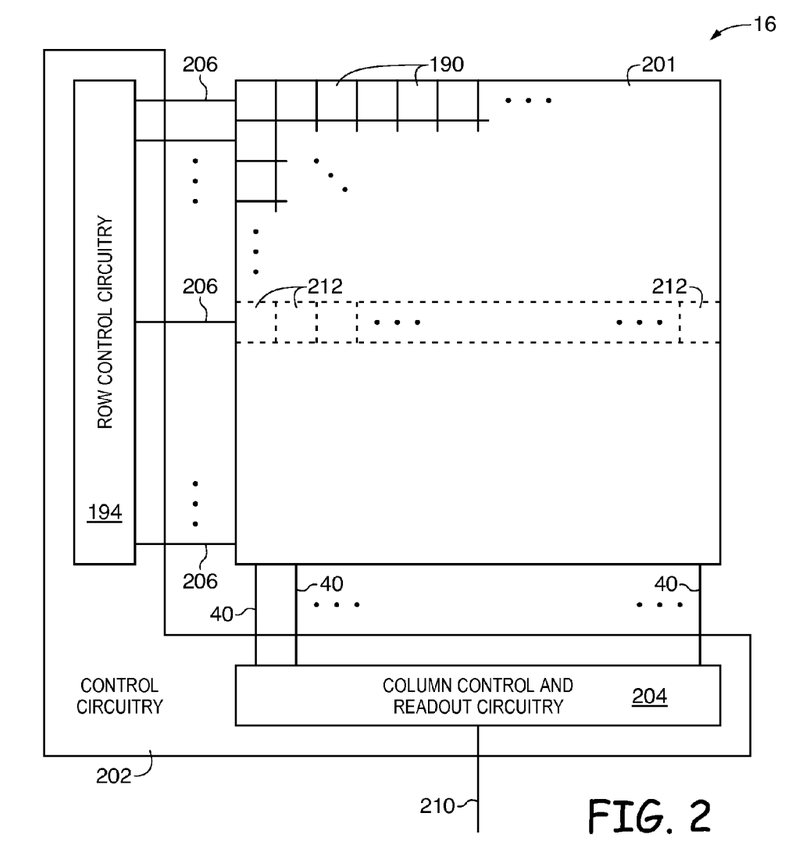
FIG. 2 is a diagram of an illustrative pixel array and associated control circuitry for generating control signals and bias signals and reading out pixel data in an image sensor in accordance with an embodiment of the present invention.

As shown in FIG. 2, image sensor 16 may include a pixel array such as pixel array 201 containing imaging pixels such as image sensor pixels 190 and application-specific pixels such as application-specific pixels 212. Imaging pixels 190 may be configured to gather image data to be used in generating images of a scene. Application-specific pixels 212 may be configured to gather data to be used for a specific application. For example, data gathered by application-specific pixels 212 may be used for auto-focusing applications, depth-sensing applications (e.g., three dimensional imaging applications), face detection applications, infrared imaging applications, phase detection applications, and/or other applications. The term "application-specific pixel" may be used herein to describe a pixel that gathers application-specific data that is not necessarily used to generate an image of a real-world scene. The application-specific data may, however, be used to generate range images, infrared images, other types of images, or may include other suitable types of data (if desired). If desired, application-specific data from application-specific pixels 212 may be used to map image data from the array of imaging pixels 190 to depth information. The term "imaging pixel" may be used to describe a pixel that gathers color image data to be used in generating images of a real-world scene. Application-specific pixels 212 may be used to enhance the images produced by imaging pixels 190 and/or may be used to perform other functions. For example, application-specific pixels 212 may include depth-sensing pixels and/or infrared imaging pixels. Depth information gathered by application-specific pixels 212 may be used to automatically and rapidly focus image sensor 16 on a particular object in a real-world scene, thereby enhancing the image generated by imaging pixels 190.

Array 201 may contain, for example, hundreds or thousands of rows and columns of image sensor pixels 190 and application-specific pixels 212. Control circuitry 202 may include row control circuitry 194 and column circuitry such as column control and readout circuitry 204. Row control circuitry 194 may be used to supply control signals such as reset, transfer, and read control signals to pixels 190 and application-specific pixels 212 over control paths 206. One or more conductive lines such as column lines 40 may be coupled to each column of pixels in array 201. Column lines 40 may be used for reading out image signals from pixels 190 and application-specific pixels 212 and for supplying bias signals (e.g., bias currents or bias voltages) to pixels 190 and application-specific pixels 212. During pixel readout operations, a pixel row in array 201 may be selected by row control circuitry 194 and image data associated with imaging pixels 190 and application-specific pixels 212 in that pixel row can be read out along column lines 40. In one suitable embodiment, application-specific data may be read out from application-specific pixels 212 between frames (e.g., between frames of image data associated with imaging pixels 190).

Column circuitry such as column control and readout circuitry 204 may be coupled to pixels 190 and application-specific pixels 212 using column lines 40. Column circuitry 204 may include sample-and-hold circuitry, amplifier circuitry, analog-to-digital conversion circuitry, bias circuitry such as pixel column bias supply circuits (e.g., circuitry such as current mirror circuitry for providing bias currents to source follower transistors of pixels 190 and application-specific pixels 212 along a pixel column), memory or other circuitry for operating pixels 190 and application-specific pixels 212 and for reading out image signals from pixels 190 and application-specific pixels 212.

In the example of FIG. 2, a sequence of adjacent application-specific pixels 212 (e.g., a row of application-specific pixels 212) is interposed between first and second sequences of adjacent imaging pixels 190 (e.g., between first and second rows of imaging pixels 190). This is, however, merely illustrative. Application-specific pixels 212 may, in general, be formed in any suitable location in array 201. For example, application-specific pixels 212 may be formed as one or more rows in array 201, one or more columns in array 201, one or more clusters of pixels in array 201 (e.g., one or more microarrays in array 201), one or more single pixels in array 201, etc.

Figure 3:
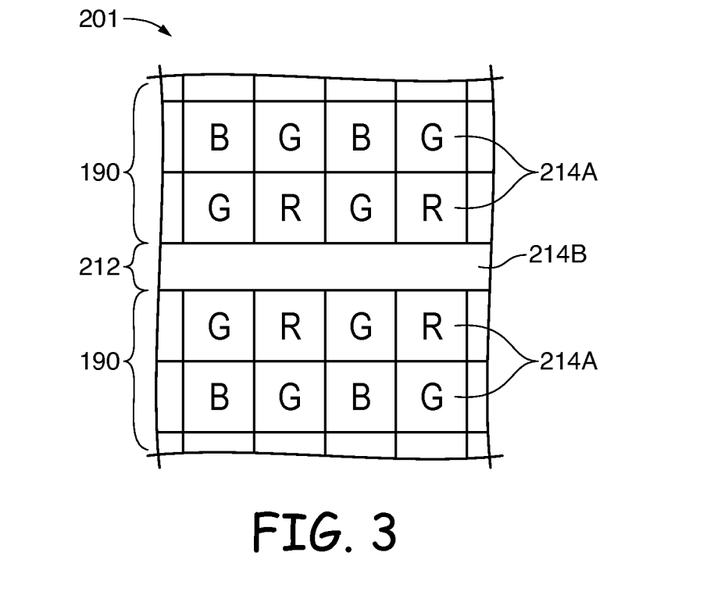
FIG. 3 is a top view of a portion of an illustrative pixel array having imaging pixels and application-specific pixels in accordance with an embodiment of the present invention.

A top view of a portion of pixel array 201 having imaging pixels 190 and application-specific pixels 212 is shown in FIG. 3. Pixel array 201 may include imaging pixels 190 arranged in rows and columns. Each imaging pixel 190 may include an associated imaging pixel circuit. A filter such as color filter 214A may be formed over each imaging pixel 190 in array 201. In the example of FIG. 3, color filters 214A are formed in a Bayer pattern of red color filter elements, blue color filter elements, and green color filter elements. This is, however, merely illustrative. If desired, color filters 214A may be formed in a cyan-magenta-yellow-key pattern or other suitable pattern.

Pixel array 201 may include application-specific pixels 212. Each application-specific pixel 212 may include an associated application-specific pixel circuit. In the example of FIG. 3, application-specific pixels 212 are formed as a row of application-specific pixels interposed between adjacent rows of imaging pixels. The row of application-specific pixels 212 may be covered by a single elongated filter such as filter 214B. Filter 214B may be optimized to pass light of any suitable wavelength band. For example, filter 214B may be optimized to pass infrared light, may be optimized to pass visible light (e.g., red light, green light, blue light, etc.), may be optically transparent, etc. If desired, filter 214B may include a combination of different types of filters. In one suitable embodiment of the invention, filters 214B associated with application-specific pixels 212 may be formed from green color filter elements. The type of filter used for application-specific pixels 212 may be optimized depending on the particular function performed by application-specific pixels 212.

Image data from imaging pixels 190 may be gathered during pixel readout operations and may be subsequently used to generate an image of a real-world scene. During pixel readout operations, pixel values from application-specific pixels 212 may be substituted with interpolated values of signals based on neighboring imaging pixel values from imaging pixels 190.

Figure 4:
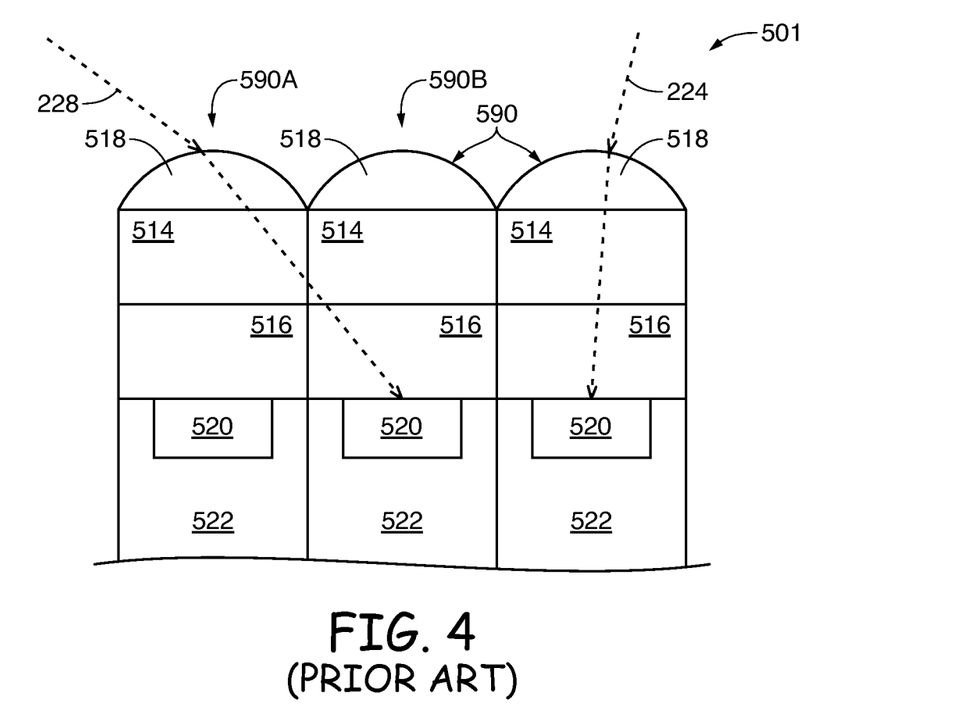
FIG. 4 is a cross-sectional side view of a portion of a conventional pixel array exhibiting optical crosstalk between adjacent pixels.

FIG. 4 shows a cross-section of a portion of a conventional pixel array 501 having pixels 590. Pixels 590 include microlens 518, color filter 514, dielectric layer 516, and photosensitive regions 520 formed in substrate layer 522.

Each microlens 518 may direct incident light towards associated photo sensitive region 522. As shown in FIG. 4, incident light 224 is directed by microlens 518 towards photosensitive region 520. Photosensitive region 520 absorbs incident light focused by microlens 518 and produces image signals that correspond to the amount of incident light absorbed.

Some light, however, passes through the color filter of a first pixel but ends up striking the photosensitive region of a second pixel (e.g., a pixel that is adjacent to the first pixel). As shown in FIG. 4, incident light 228 passes through color filter 514 of pixel 590A but ends up striking photosensitive region 520 of pixel 590B. This type of "light leakage" is often referred to as optical crosstalk. If care is not taken, optical crosstalk can degrade the quality of images produced by an image sensor.

Optical crosstalk may sometimes be accounted for during image processing (e.g., during the color interpolation process). Color interpolation techniques which are specific to a Bayer imaging array have been developed which may be used to reduce the effects of optical crosstalk in a Bayer imaging array. However, the presence of application-specific pixels 212 in array 201 (FIG. 3) may introduce non-uniformity in the Bayer color filter array pattern, which may in turn undermine the efforts of color interpolation to reduce optical crosstalk. Due to various factors, optical crosstalk that occurs between imaging pixels 190 and adjacent application-specific pixels 212 may be difficult to account for during the interpolation process. For example, the optical crosstalk from imaging pixel 190 to application-specific pixel 212 may be asymmetric for a given angle of incidence. If care is not taken, optical crosstalk between imaging pixels 190 and application-specific pixels 212 may degrade the quality of an image produced by pixels 190 and/or may prevent application-specific pixels 212 from functioning properly.

Figure 5:
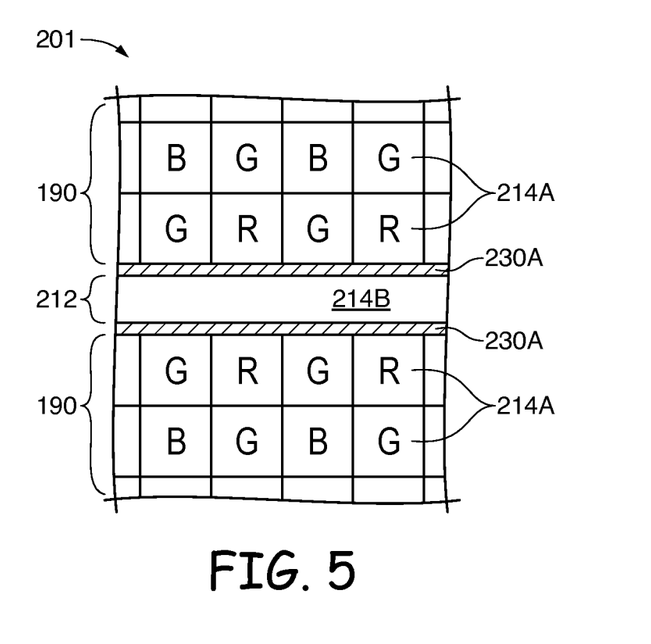
FIG. 5 is a top view of a portion of an illustrative pixel array having color filter barriers interposed between imaging pixels and application-specific pixels in accordance with an embodiment of the present invention.

FIG. 5 is a top view of a portion of pixel array 201 in which barriers are used to reduce optical crosstalk between imaging pixels 190 and application-specific pixels 212. As shown in FIG. 5, a row of application-specific pixels 212 may be interposed between first and second adjacent rows of imaging pixels 190. Barriers such as elongated color filter barriers 230A may be formed on opposing sides of the row of application-specific pixels 212. As shown in FIG. 5, a first barrier 230 may be interposed between the row of application-specific pixels 212 and a first adjacent row of imaging pixels 190, while a second barrier 230 may be interposed between the row of application-specific pixels 212 and a second adjacent row of imaging pixels 190. Color filter barrier 230A may therefore form a divider between application-specific pixels 212 and imaging pixels 190. Color filter barrier 230A may be formed from any suitable opaque photodefinable material (e.g., a black photodefinable material, a gray photodefinable material, etc.). For example, barrier 230A may be formed from a carbon-containing material, may be formed from a mixture of red, green, and blue color filter material, or may be formed from other suitable materials having high light attenuation properties in a desired range of wavelengths.

Barrier 230A may be formed over application-specific pixels 212 or may be formed over imaging pixels 190. In the example of FIG. 5, barrier 230A is formed over a portion of imaging pixels 190. Barrier 230A may reduce or eliminate optical crosstalk between application-specific pixels 212 and imaging pixels 190 by absorbing light that strikes barrier 230A.

Figure 6:
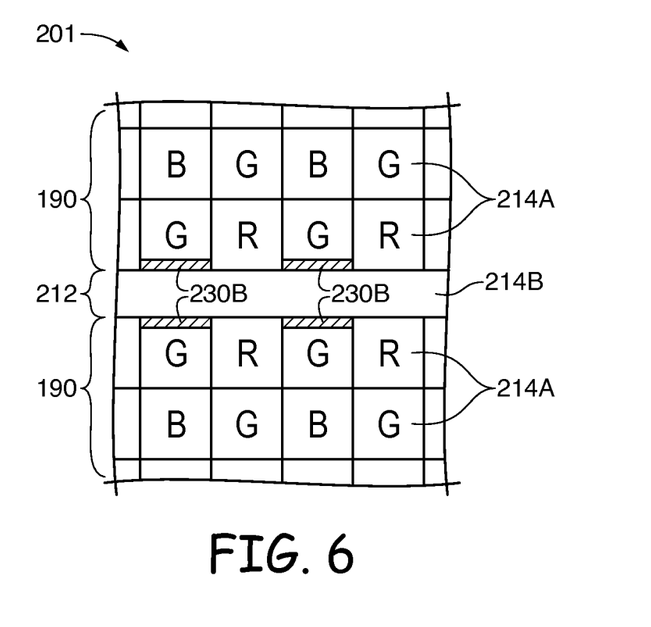
FIG. 6 is a top view of a portion of an illustrative pixel array having color filter barriers selectively interposed between imaging pixels and application-specific pixels in accordance with an embodiment of the present invention.

FIG. 6 is a top view of a portion of pixel array 201 in which barriers are selectively formed in between individual pixels. As shown in FIG. 6, barriers such as color filter barriers 230B may be formed adjacent to application-specific pixels 212. Each barrier 230B may be interposed between an application-specific pixel 212 and an adjacent imaging pixels 190. If desired, barriers 230B may be formed between application-specific pixels 212 and green imaging pixels 190.

Color filter barrier 230B may be formed from any suitable photodefinable material. Barrier 230B may, for example, be formed from blue photodefinable material. Forming color filter barrier 230B from blue photodefinable material may restore some of the desirable characteristics of a Bayer color filter array. For example, consider the embodiment in which green color filters are formed over application-specific pixels 212. Without barriers 230B, green application-specific pixels 212 would be directly adjacent to green imaging pixels 190. Because directly adjacent green pixels are not present in a typical Bayer imaging array, optical crosstalk between adjacent green pixels is not typically accounted for in Bayer array color interpolation processes. However, optical crosstalk between adjacent green and blue pixels is often accounted for in Bayer array color interpolation processes. Thus, by forming blue color filter barriers 230B between application-specific pixels 212 and adjacent green imaging pixels 190, certain characteristics of the Bayer imaging array may be restored and optical crosstalk may be reduced or eliminated.

This is, however, merely illustrative. If desired, color filter barrier 230B may be formed from photodefinable material of any suitable color. For example, color filter barrier 230B may be formed from photodefinable material of a black color, of a red color, of a green color, of a blue color, or of any other suitable color. Array 201 may, for example, include multiple color filter barriers 230B having different colors and different locations in the array. The color used for barrier 230B may be optimized depending on the adjacent pixels which are separated by barrier 230B and/or depending on other factors. For example, if optical crosstalk of a particular wavelength band is undesired for a specific pixel or collection of pixels, then the color filter barrier adjacent to that pixel or collection of pixels may be chosen to specifically filter out that particular wavelength band. Barriers 230B may be formed in any suitable location in array 201. For example, barriers 230B may be formed in between application-specific pixels 212 and imaging pixels 190, between adjacent application-specific pixels 212, and/or between adjacent imaging pixels 190.

Figure 7:
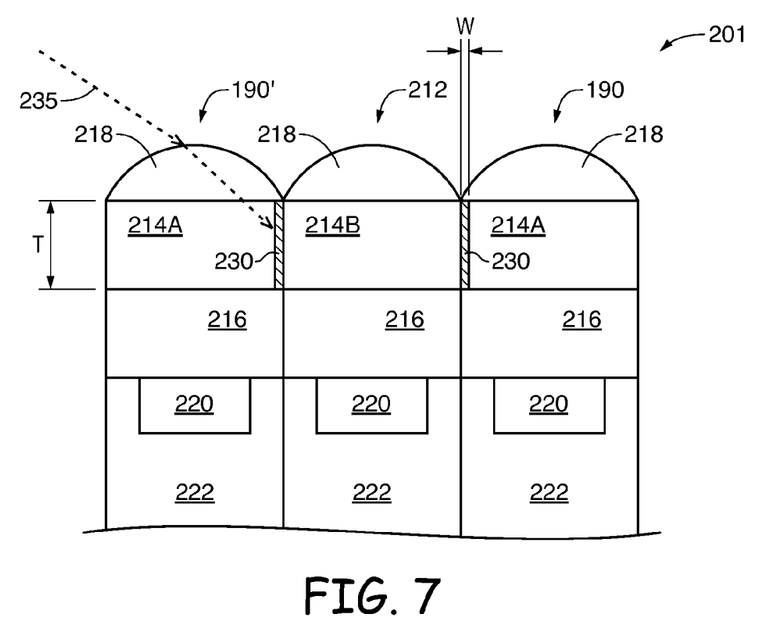
FIG. 7 is a cross-sectional side view of a portion of an illustrative pixel array having color filter barriers interposed between imaging pixels and application-specific pixels in accordance with an embodiment of the present invention.

A cross-sectional side view of a portion of array 201 having color filter barriers is shown in FIG. 7. Pixels 190 may include microlens 218, color filter 214A, an optional stack of dielectric layers 216, and a photosensitive region such as photosensitive region 220 formed in substrate layer 222. Pixels 212 may include microlens 218, color filter 214B, an optional stack of dielectric layers 216, and a photosensitive region such as photosensitive region 220 formed in substrate layer 222. Each microlens 218 may direct incident light towards associated photo sensitive region 220.

Color filter barriers such as color filter barriers 230 (sometimes referred to as color filter dividers, crosstalk suppression structures, or pixel isolation structures) may be interposed between imaging pixels 190 and application-specific pixels 212. Barriers 230 may be formed from an opaque material (e.g., similar to barriers 230A of FIG. 5), may be formed from blue photodefinable material (e.g., similar to barriers 230B of FIG. 6), may be formed from other suitable material (e.g., red photodefinable material, green photodefinable material, blue photodefinable material, black photodefinable material, carbon-containing material, etc.), or may be formed from a combination of these materials.

Barriers 230 may have a thickness such as thickness T and a width such as width W. Thickness T of barriers 230 may be the same or substantially the same as the thickness of color filters 214A and 214B. Width W of barriers 230 may be customized depending on pixel size and depending on the desired performance characteristics of the imager. For example, the pixel size of pixels 190 and 212 may be 1-2 µm, 2-3 µm, 4-5 µm, 5-6 µm, more than 6 µm, more than 20 µm, less than 20 µm, etc. Width W of barrier 230 may be 0.1-0.2 µm, 0.2-0.3 µm, 0.3-0.4 µm, 0.4-0.5 µm, more than 0.5 µm, less than 0.5 µm, etc. Width W may be sufficiently wide to reduce or eliminate optical crosstalk without negatively affecting the performance of the pixel over which the barrier is formed. As an illustrative example, pixels having a pixel size of 3-4 µm may have a barrier of about 0.1-0.2 µm wide. This is, however, merely illustrative. Width W of barrier 230 may be customized and optimized based on the characteristics and desired performance of the imaging array in which barriers 230 are used.

Barriers 230 may reduce or eliminate optical crosstalk. Barriers 230 may be especially effective for reducing optical crosstalk that results from light striking microlenses 218 at high angles of incidence. For example, incident light such as incident light 235 may strike microlens 218 of pixel 190' at a high angle of incidence and may be initially directed towards adjacent pixel 212. Barrier 230 may absorb and/or reflect incident light 235, thereby preventing light 235 from striking photosensitive region 220 of adjacent pixel 212.

In the example of FIG. 7, barriers 230 are formed over imaging pixels 190. This is merely illustrative. If desired, barriers 230 may be formed over application-specific pixels 212. The desired location of barriers 230 may depend on the desired performance characteristics of the imaging array.

Figure 8:
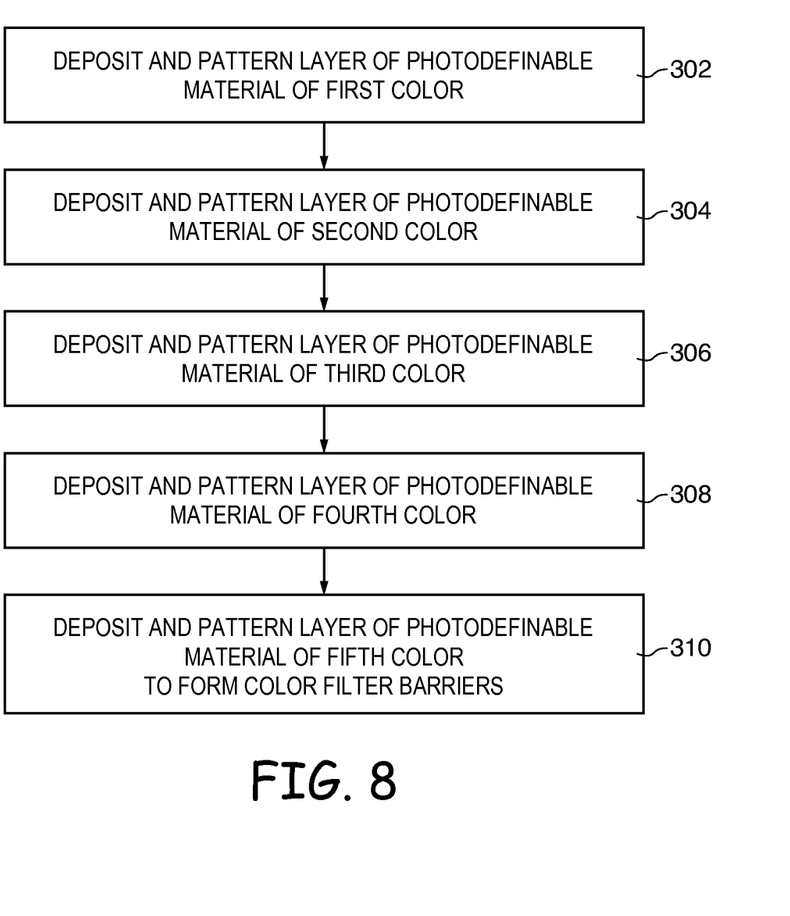
FIG. 8 is a flow chart of illustrative steps involved in forming a color filter array having color filter barriers in accordance with an embodiment of the present invention.

FIG. 8 is a flow chart of the illustrative steps involved in forming a color filter array having opaque barriers such as black color filter barriers that reduce or eliminate optical crosstalk between imaging pixels and application-specific pixels.

At step 302, a layer of photodefinable material of a first color may be deposited on a substrate layer (e.g., a substrate layer such as substrate layer 222 or optional dielectric layer 216 of FIG. 7). After depositing the layer of photodefinable material of the first color on the substrate layer, the photodefinable material may be patterned to form an array of color filter elements of the first color. This may include, for example, forming an array of green color filter elements over imaging pixels 190. Patterning may include selectively applying a mask to the photodefinable material and subsequently exposing the photodefinable material to light to remove portions of the photodefinable material. For example, portions of the first color photodefinable material that are formed over application-specific pixels 212 may be removed during step 302.

At step 304, a layer of photodefinable material of a second color may be deposited on the substrate layer. After depositing the layer of photodefinable material of the second color on the substrate layer, the photodefinable material may be patterned to form an array of color filter elements of the second color. This may include, for example, forming an array of red color filter elements over imaging pixels 190. Patterning may include selectively applying a mask to the photodefinable material and subsequently exposing the photodefinable material to light to remove portions of the photodefinable material.

At step 306, a layer of photodefinable material of a third color may be deposited on the substrate layer. After depositing the layer of photodefinable material of the third color on the substrate layer, the photodefinable material may be patterned to form an array of color filter elements of the third color. This may include, for example, forming an array of blue color filter elements over imaging pixels 190. Patterning may include selectively applying a mask to the photodefinable material and subsequently exposing the photodefinable material to light to remove portions of the photodefinable material.

At step 308, a layer of photodefinable material of a fourth color may be deposited on the substrate layer. After depositing the layer of photodefinable material of the fourth color on the substrate layer, the photodefinable material may be patterned to form an array of color filter elements of the fourth color. This may include, for example, forming green color filter elements over application-specific pixels 212 (e.g., forming an elongated green color filter element over a row of application-specific pixels 212). Patterning may include selectively applying a mask to the photodefinable material and subsequently exposing the photodefinable material to light to remove portions of the photodefinable material. For example, portions of the fourth color photodefinable material that are formed over imaging pixels 190 may be removed during step 308.

Application-specific pixels 212 may be provided with any suitable type of color filter element. If desired, color filter elements formed over application-specific pixels 212 and color filter elements formed over imaging pixels 190 may be formed during the same processing step. For example, the fourth color of photodefinable material (applied during step 308) may be the same as the first color of photodefinable material (applied during step 302). If desired, color filters associated with application-specific pixels 212 may be formed during step 302 (e.g., green color filter elements for application-specific pixels 212 and imaging pixels 190 may be formed during the same processing step). If application-specific color filters are formed during step 302, step 308 may be eliminated. At step 310, a layer of photodefinable material of a fifth color may be deposited on the substrate layer. After depositing the layer of photodefinable material of the fifth color, the photodefinable material may be patterned to form color barriers (e.g., to form barriers 230 of FIG. 7). Patterning may include selectively applying a mask to the photodefinable material and subsequently exposing the photodefinable material to light to remove portions of the photodefinable material. For example, portions of the fifth color photodefinable material that are formed over application-specific pixels 212 may be removed during step 310. The fifth color used to form color barriers during step 310 may be an opaque color such as black, or may be formed from other suitable colors such as blue.

The steps illustrated by the flow chart of FIG. 8 may be performed in any suitable order and may include any suitable combination of colors. For example, the first, second, third, fourth, and fifth colors may be different colors, may be the same colors, or may have some colors which are the same and other colors which are different. In one suitable embodiment, the first color may be green, the second color may be red, the third color may be blue, the fourth color may be green, and the fifth color may be black. This is, however, merely illustrative. In general, any suitable combination of colors and any suitable order of processing steps may be used.

Figure 9:
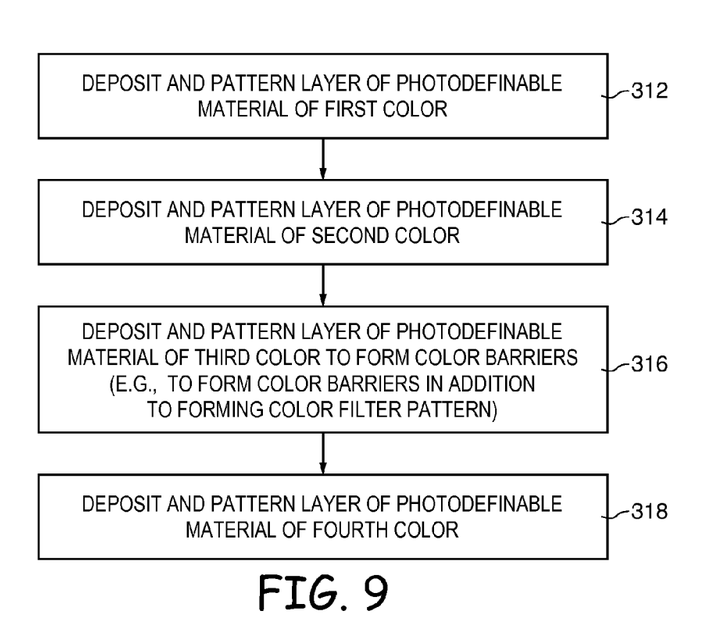
FIG. 9 is a flow chart of illustrative steps involved in forming a color filter array having color filter barriers in accordance with an embodiment of the present invention.

FIG. 9 is a flow chart of the illustrative steps involved in forming a color filter array having barriers such as blue color filter barriers that reduce or eliminate optical crosstalk between imaging pixels and application-specific pixels.

At step 312, a layer of photodefinable material of a first color may be deposited on a substrate layer (e.g., a substrate layer such as substrate layer 222 or optional dielectric layer 216 of FIG. 7). After depositing the layer of photodefinable material of the first color on the substrate layer, the photodefinable material may be patterned to form an array of color filter elements of the first color. This may include, for example, forming an array of green color filter elements over imaging pixels 190. Patterning may include selectively applying a mask to the photodefinable material and subsequently exposing the photodefinable material to light to remove portions of the photodefinable material. For example, portions of the first color photodefinable material that are formed over application-specific pixels 212 may be removed during step 312.

At step 314, a layer of photodefinable material of a second color may be deposited on the substrate layer. After depositing the layer photodefinable material of the second color on the substrate layer, the photodefinable material may be patterned to form an array of color filter elements of the second color. This may include, for example, forming an array of red color filter elements over imaging pixels 190. Patterning may include selectively applying a mask to the photodefinable material and subsequently exposing the photodefinable material to light to remove portions of the photodefinable material.

At step 316, a layer of photodefinable material of a third color may be deposited on the substrate layer. After depositing the layer of photodefinable material of the third color, the photodefinable material may be patterned to form an array of color filter elements of the third color. This may include, for example, forming an array of blue color filter elements over imaging pixels 190 and forming color filter barriers 230. Patterning may include selectively applying a mask to the photodefinable material and subsequently exposing the photodefinable material to light to remove portions of the photodefinable material. For example, portions of the third color photodefinable material that are formed over application-specific pixels 212 may be removed during step 316.

At step 318, a layer of photodefinable material of a fourth color may be deposited on the substrate layer. After depositing the layer of photodefinable material of the fourth color on the substrate layer, the photodefinable material may be patterned to form an array of color filter elements. This may include, for example, forming green color filter elements over application-specific pixels 212 (e.g., forming an elongated green color filter element over a row of application-specific pixels 212). Patterning may include selectively applying a mask to the photodefinable material and subsequently exposing the photodefinable material to light to remove portions of the photodefinable material. For example, portions of the fourth color photodefinable material that are formed over imaging pixels 190 may be removed during step 318.

Application-specific pixels 212 may be provided with any suitable type of color filter element. If desired, color filter elements formed over application-specific pixels 212 and color filter elements formed over imaging pixels 190 may be formed during the same processing step. For example, the fourth color of photodefinable material (applied during step 318) may be the same as the first color of photodefinable material (applied during step 312). If desired, color filters associated with application-specific pixels 212 may be formed during step 312 (e.g., green color filter elements for application-specific pixels 212 and imaging pixels 190 may be formed during the same processing step). If application-specific color filters are formed during step 312, step 318 may be eliminated.

The steps illustrated by the flow chart of FIG. 9 may be performed in any suitable order and may include any suitable combination of colors. For example, the first, second, third, and fourth colors may be different colors, may be the same colors, or may have some colors which are the same and other colors which are different. In one suitable embodiment, the first color may be green, the second color may be red, the third color may be blue, and the fourth color may be green. This is, however, merely illustrative. In general, any suitable combination of colors and any suitable order of processing steps may be used.

Figure 10:
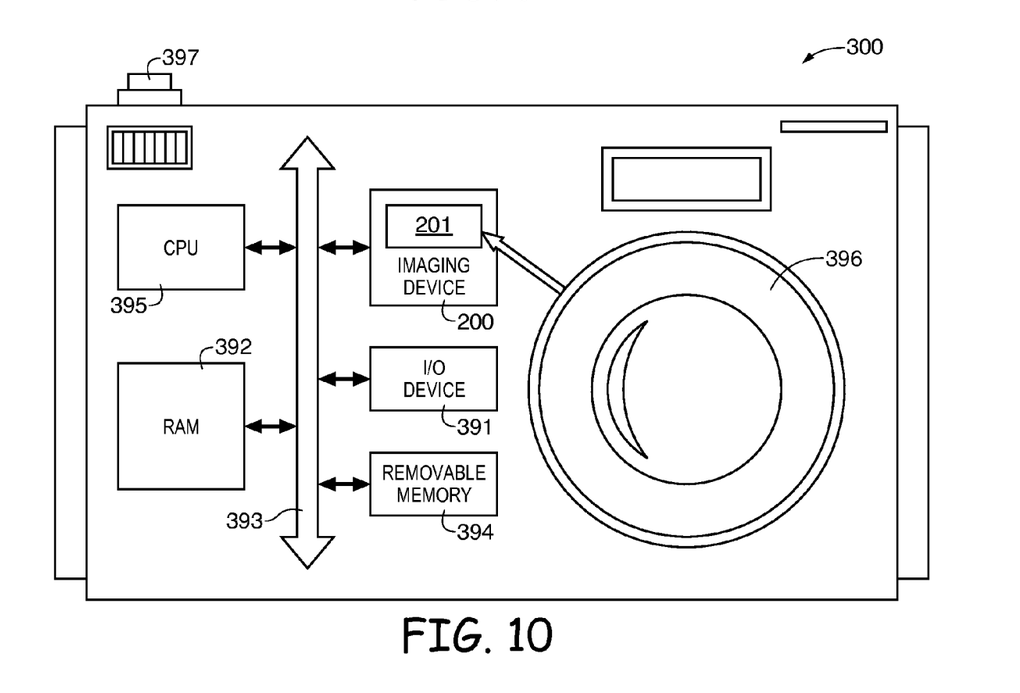
FIG. 10 is a block diagram of an imager employing the embodiment of FIG. 7 in accordance with an embodiment of the present invention.

FIG. 10 shows in simplified form a typical processor system 300, such as a digital camera, which includes an imaging device 200. Imaging device 200 may include a pixel array 201 of the type shown in FIG. 2 having color filter barriers interposed between imaging pixels and application-specific pixels as described above. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating image sensors that have color filter barriers. Image sensors with color filter barriers may be used in an electronic device.

An image sensor may have a pixel array which includes imaging pixels and application-specific pixels. The application specific pixels may include depth-sensing pixels or infrared imaging pixels. A row of application-specific pixels may be interposed between rows of imaging pixels. To reduce optical crosstalk between the imaging pixels and application-specific pixels, color filter barriers may be formed between the imaging pixels and the application-specific pixels.

An array of color filter elements may be formed over the array of pixels. The array of color filter elements may include a Bayer color filter array formed over the imaging pixels and an elongated filter element such as an elongated green color filter element formed over the row or application-specific pixels.

In one suitable embodiment, an elongated color filter barrier may be formed on opposing sides of the row of application-specific pixels. The elongated color filter barrier may be formed from an opaque material such as an opaque carbon-containing material. The elongated color filter barrier may be configured to prevent light from passing directly between an imaging pixel and an adjacent application-specific pixel.

In another suitable embodiment, color filter barriers may be selectively positioned between individual pixels. The color filter barriers may, for example, be interposed between a green application-specific pixel and an adjacent green imaging pixel. The color filter barriers may, for example, be formed from blue photodefinable material. The color filter barrier may be configured to prevent light from passing directly between an imaging pixel and an adjacent application-specific pixel.

The color filter barriers may be formed during the color filter array fabrication process. In one suitable embodiment, the color filters may be formed over portions of the imaging pixels.

The foregoing is merely illustrative of the principles of this invention which can be practiced in other embodiments.

What is claimed is:

1. An image sensor, comprising:
an array of pixels including a plurality of imaging pixels and a plurality of application-specific pixels; and
a plurality of color filter elements, wherein each color filter element in the plurality of color filter elements is formed over an associated pixel in the array of pixels, wherein the plurality of color filter elements includes at least one barrier structure interposed between an imaging pixel in the plurality of imaging pixels and an adjacent application-specific pixel in the plurality of application-specific pixels, wherein the plurality of application-specific pixels are arranged in a sequence of adjacent application-specific pixels, wherein the sequence of adjacent application-specific pixels is interposed between first and second sequences of adjacent imaging pixels, and wherein the plurality of color filter elements includes an elongated color filter element formed over the sequence of adjacent application-specific pixels.

2. The image sensor defined in claim 1, wherein the plurality of imaging pixels are arranged in rows and columns of imaging pixels, wherein the sequence of adjacent application-specific pixels comprises a row of application-specific pixels, wherein the first sequence of adjacent imaging pixels comprises a first row of imaging pixels, wherein the second sequence of adjacent imaging pixels comprises a second row of imaging pixels, and wherein the at least one barrier structure includes a first elongated barrier structure interposed between the row of application-specific pixels and the first row of imaging pixels and a second elongated barrier structure interposed between the row of application-specific pixels and the second row of imaging pixels.

3. The image sensor defined in claim 1, wherein the plurality of color filter elements includes an array of color filter elements formed over the plurality of imaging pixels in a Bayer color filter pattern and wherein the elongated color filter element comprises green photodefinable material.

4. The image sensor defined in claim 1, wherein the at least one barrier structure comprises gray photodefinable material.

5. An image sensor, comprising:
an array of pixels including a plurality of imaging pixels and a plurality of application-specific pixels; and
a plurality of color filter elements, wherein each color filter element in the plurality of color filter elements is formed over an associated pixel in the array of pixels, wherein the plurality of color filter elements includes at least one barrier structure interposed between an imaging pixel in the plurality of imaging pixels and an adjacent application-specific pixel in the plurality of application-specific pixels, and wherein the at least one barrier structure comprises an opaque material configured to absorb visible light.

6. The image sensor defined in claim 5, wherein the opaque material comprises carbon.

7. The image sensor defined in claim 5, further comprising:
a plurality of microlenses arranged over the plurality of color filter elements; and
a substrate layer comprising a plurality of photosensitive regions, wherein each microlens in the plurality of microlenses is configured to focus light onto a respective photosensitive region in the plurality of photosensitive regions through an associated color filter element in the plurality of color filter elements.

8. A method for forming a color filter array over a pixel array that includes imaging pixels and application-specific pixels, comprising:
providing a substrate layer with the pixel array;
depositing and patterning photodefinable material of a first color on the substrate layer to form a plurality of color filter elements of the first color;
depositing and patterning photodefinable material of a second color on the substrate layer to form a plurality of color filter elements of the second color; and
depositing and patterning photodefinable material of a third color on the substrate layer to form a plurality of color filter elements of the third color and to form a plurality of color filter barriers, wherein each color filter barrier in the plurality of color filter barriers is interposed between an adjacent imaging pixel in the pixel array and an adjacent application-specific pixel in the pixel array, and wherein patterning the third color of photodefinable material comprises removing portions of the third photodefinable material that are formed over the application-specific pixels.

9. The method defined in claim 8, wherein the application-specific pixels are formed in a row of application-specific pixels interposed between first and second adjacent rows of imaging pixels and wherein depositing and patterning the third color of photodefinable material on the substrate layer comprises:
forming a first color filter barrier between the row of application-specific pixels and the first adjacent row of imaging pixels; and
forming a second color filter barrier between the row of application-specific pixels and the second adjacent row of imaging pixels.

10. The method defined in claim 8, wherein patterning the first color of photodefinable material comprises removing portions of the first color of photodefinable material that are formed over the application-specific pixels.

11. The method defined in claim 8, further comprising:
depositing and patterning photodefinable material of a fourth color on the substrate layer to form a plurality of color filter elements of the fourth color.

12. The method defined in 11, wherein patterning the fourth color of photodefinable material comprises removing portions of the fourth color of photodefinable material that are formed over the imaging pixels.

13. A system, comprising:
a central processing unit;
memory;
input-output circuitry; and
an imaging device, wherein the imaging device comprises:
a pixel array having a plurality of imaging pixels and a plurality of application-specific pixels;
a lens that focuses light onto the pixel array; and
a color filter array formed over the pixel array and having a plurality of color filter dividers, wherein each color filter divider in the plurality of color filter dividers is interposed between an associated imaging pixel in the plurality of imaging pixels and an adjacent application-specific pixel in the plurality of application-specific pixels, wherein each color filter divider in the plurality of color filter dividers is configured to prevent light from passing between the associating imaging pixel and the adjacent application-specific pixel, and wherein the color filter array includes a Bayer color filter array formed over the plurality of imaging pixels and a plurality of green color filter elements formed over the plurality of application-specific pixels.

14. The system defined in claim 13, wherein the plurality of application-specific pixels comprises a plurality of depth-sensing pixels.

15. The system defined in claim 13, wherein the plurality of application-specific pixels comprises a plurality of infrared imaging pixels.

16. The system defined in claim 13, wherein the plurality of color filter dividers comprises blue photodefinable material.

17. The system defined in claim 13, wherein the plurality of color filter dividers comprises carbon.

18. The system defined in claim 13, wherein the plurality of color filter dividers comprises a mixture of red photodefinable material, green photodefinable material, and blue photodefinable material.

19. The system defined in claim 13, wherein the imaging device comprises a backside illumination image sensor.

\* \* \* \* \*